United States Patent [19]

Rao

[11] Patent Number: 5,598,374
[45] Date of Patent: Jan. 28, 1997

[54] PIPELAND ADDRESS MEMORIES, AND SYSTEMS AND METHODS USING THE SAME

[75] Inventor: G. R. Mohan Rao, Dallas, Tex.

[73] Assignee: Cirrus Logic, Inc., Fremont, Calif.

[21] Appl. No.: 502,479

[22] Filed: Jul. 14, 1995

[51] Int. Cl.⁶ .................................................. G11C 7/00
[52] U.S. Cl. ....................... 365/230.03; 365/203; 365/221
[58] Field of Search .............................. 365/230.03, 203, 365/233, 238.5, 221, 239, 240, 189.12

[56] References Cited

U.S. PATENT DOCUMENTS

| 4,570,242 | 2/1986 | Nagami | 365/222 |
|---|---|---|---|
| 4,691,303 | 9/1987 | Churchward et al. | 365/222 |
| 4,754,425 | 6/1988 | Bhadriraju | 364/900 |
| 4,831,594 | 5/1989 | Khosrovi et al. | 365/222 |
| 5,068,828 | 11/1991 | Miyaoka et al. | 365/203 |
| 5,159,572 | 10/1992 | Morton | 365/230.06 |
| 5,265,231 | 11/1993 | Nuwayser | 395/425 |
| 5,329,490 | 7/1994 | Murotani | 365/222 |
| 5,345,577 | 9/1994 | Chan et al. | 395/425 |
| 5,495,444 | 2/1996 | Okubo et al. | 365/230.03 |
| 5,506,810 | 4/1996 | Runas | 365/230.03 |

Primary Examiner—Viet Q. Nguyen
Assistant Examiner—Vu A. Le
Attorney, Agent, or Firm—Winstead Sechrest & Minick, P.C.

[57] ABSTRACT

A dynamic random access memory device 200 includes circuitry 202 for generating a plurality of internal row address strobes. A plurality of memory banks 201 are included, each having an array 203 of dynamic random access cells and associated dynamic control circuitry. A first one of the memory banks 201 enters precharge in response to a precharged cycle of a first one of the internal row address strobes. Simultaneously, a second one of the banks 201 enters an active cycle in response to an active cycle of a second one of the internal address strobes.

21 Claims, 3 Drawing Sheets

PIPELAND ADDRESS MEMORIES, AND SYSTEMS AND METHODS USING THE SAME

TECHNICAL FIELD OF THE INVENTION

The present invention relates in general to electronic memories and in particular to pipelined address memories, and systems and methods using the same.

BACKGROUND OF THE INVENTION

Presently, most memory systems are either constructed from static random access memory devices (SRAMs) or dynamic random access memory devices (DRAMs). Each type of memory device has advantages and disadvantages, and as a result DRAMs and SRAMS are typically restricted to different applications. SRAMs are faster and are typically used in applications where fast access times and high bandwidth are critical, such as in cache memories. SRAMs however consume more power, are more expensive to fabricate, and provide fewer cells (bits) per given chip space. On the other hand, while slower than SRAMs, DRAMs are typically less expensive, consume substantially less power, and provide more bits in the same chip space. DRAMs are typically used to construct larger memory subsystems, such as system memories and display frame buffers, and in other instances where high speed is not critical.

One particular reason DRAMs have a speed disadvantage compared to SRAMs is a result of the fact that most DRAMs are constructed from dynamic circuitry. Dynamic memory circuitry operates in dynamic cycles each of which consists of two different subcycles, namely an active cycle (subcycle) and a precharge cycle (subcycle) (this is in contrast to fully static SRAMs which do not require a precharge cycle). During the active cycle, which are typically 60–70 nanoseconds in length, addresses are presented and accesses to corresponding locations performed. During the intervening precharge cycle, also approximately 60–70 nanoseconds in length, the dynamic circuitry prepares for the next active cycle. Generally, critical nodes are brought to their optimum voltages, with some circuitry, such as the row and column decoder circuitry brought to ground, while other circuitry, such as the sense amplifiers are brought to equilibrium (i.e. the bitlines are equalized to a predetermined voltage). Additionally, the wordlines are all (typically) brought to ground. While the dynamic circuitry of DRAMs conserves power since unused circuitry is turned-off during precharge, the two cycle operation results in a latency penalty vis-a-vis fully static SRAMs which operate only in an active cycle.

By eliminating or minimizing the latency penalty which DRAMs suffer, substantial improvements is speeds could be achieved. In view of the fact that DRAMs are less expensive, consume less power, and provide more storage cells per chip than SRAMs, such an improvement would be highly advantageous. With improved speed, DRAMs can be used in higher bandwidth applications, including some of those which presently require the use of SRAMs. Thus, the need has arisen for improved dynamic random access memories, improved methods of operating dynamic random access memories, and systems using the same.

SUMMARY OF THE INVENTION

The present invention eliminates the latency between accesses occurring during the precharge cycle of presently available DRAM devices. In particular, according to the principles of the present invention, at least two independent banks of memory cells on a monolithic IC are provided. While one bank is in an active cycle and an access is being made to a location within the array of that bank, the second bank is simultaneously being precharged. When precharge of the second bank is complete and any desired accesses to the first bank have been made, the first bank enters precharge and the second bank enters an active cycle. Accesses can be then made to the second bank while the first bank is being precharged.

In one embodiment, this technique is implemented using internal row address strobes, a first of which controls the active/precharge timing of the first memory bank and a second of which controls the active/precharge cycle timing of the second memory bank. For two memory banks, the first and second internal row address strobes are preferably complements of each other. In a second embodiment, the first and second memory banks (units) are controlled by separate precharge and active control circuitry. In this case, one bank is placed in precharge under the control of precharge signals received from the precharge control circuitry via a dedicated precharge bus. At least one other memory unit is simultaneously in an active cycle under the control of active cycle control signals provided to such unit via a dedicated active cycle bus.

According to one particular embodiment of the present invention, a dynamic random access memory device is provided which includes circuitry for generating a plurality of internal row address strobes. A plurality of memory banks is included, each of which has an array of dynamic random access memory cells and associated dynamic control circuitry. A first one of the banks enters precharge in response to a precharge cycle of a first one of the internal row address strobes. Simultaneously, a second one of the banks enters an active cycle in response to an active cycle of a second one of the internal row address strobes.

A method is provided for operating a device including a plurality of memory banks, each bank having an array of memory cells and associated control circuitry. The method includes the step of receiving an external row address strobe generated by an external device, the row address strobe including a logic high period and a logic low period. During the logic high period of the row address strobe, a first one of the memory banks enters an active cycle and a second one of the memory banks enters a precharge cycle. During the logic low period of the row address strobe, the first memory bank enters a precharge cycle and the second memory bank enters an active cycle.

According to a further embodiment of the present invention, a memory is provided including a first memory bank comprising an array of memory cells and associated access control circuitry including sense amplifiers, address decoding circuitry, and precharge control circuitry. A second memory bank is included which comprises an array of memory cells and associated access control circuitry including sense amplifiers, address decoding circuitry, and precharge control circuitry. At least one address bus is provided for transferring row and column addresses to the access control circuitry of the respective first and second banks. A data bus is included for exchanging data with the first and second memory banks. Row clock generator circuitry is included for receiving a row address from an external source and generating in response internal row clocks, the internal row clocks timing active and precharge cycles of the first and second memory banks such that a selected one of the memory banks is in an active cycle and another selected one of the memory banks is substantially simultaneously in a precharge cycle. In another embodiment, a synchronous external clock, generates internal RAS and CAS signals. The operation is similar to the above.

The principles of the present invention are also embodied in a pipelined address memory system. A plurality of memory units are included, each having an array of memory cells and circuitry for accessing selected ones of the cells in the array. A precharge bus is provided for carrying precharge control signals and an active bus is provided for carrying active cycle control signals. Circuitry is coupled to the precharge bus for generating the precharge control signals. Circuitry is coupled to the active bus for generating the active cycle control signals. Circuitry is also included for selectively coupling the memory units to the precharge bus for precharge and to the active bus for active operation.

A method is disclosed for operating a pipelined memory system, the pipelined memory system including a plurality of memory units, each memory unit including an array of memory cells and circuitry for accessing locations in the array, a precharge bus for carrying precharge control signals generated by associated precharge control circuitry, and an active bus for carrying active cycle control signals generated by active cycle control circuitry. The method includes the step of coupling a first selected one of the memory units to the active bus. An access is then performed to a selected location in the array of the first memory unit under the control of the active cycle control signals on the active bus. A second selected one of the memory units is coupled to the precharge bus. Substantially simultaneously with the step of performing an access to the first memory unit, a precharge of the second memory unit is performed under the control of the precharge control signals on the precharge bus.

Another pipelined address memory is provided according to the principles of the present invention. The pipelined address memory system includes a plurality of independent memory units each including an array of dynamic random access memory cells, dynamic control circuitry, and an address register. The system also includes a precharge bus, an active cycle bus, active clock circuitry for generating clocks for memory unit active cycle operations, and precharge clock circuitry for generating clocks for memory unit precharge operations. Bus control circuitry is provided for selectively coupling a first selected one of the memory units with the active clock circuitry via the active bus for active cycle operation of the first memory unit and a second selected one of the memory units to the precharge clock circuitry for simultaneous precharge operation of the second memory unit. An address bus is included for providing addresses to the address registers of the memory units for use during subsequent memory accesses during active cycle operation of a corresponding said memory unit.

The principles of the present invention provide substantial advantages over the prior art. In particular, systems, methods and circuits embodying the principles of the present invention eliminate or minimize the latency penalties which DRAMs suffer, thereby providing a substantial improvement in speed. With improved speed, such DRAMs can be used in higher bandwidth applications, including some of those which presently require the use of SRAMs. All the primary advantages of using DRAMs are maintained, including the reduced consumption of power, the provision of more storage cells per chip than SRAMs, and substantially less cost in fabrication compared with the fabrication of DRAMs. These inventions apply to two clock multiplexed address schemes (RAS and CAS schemes), non-multiplexed address schemes with one clock (like CE, chip enable). Synchronous DRAMs (a single master memory clock synchronizing internal operations) or even "burst mode" DRAMs.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE INVENTION

The principles of the present invention and their advantages are best understood by referring to the illustrated embodiment depicted in FIGS. 1–4 of the drawings, in which like numbers designate like parts.

Figure 1:
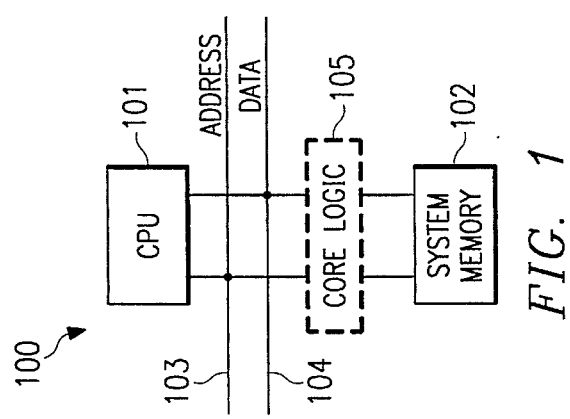
FIG. 1 is a functional block diagram of a processing system, such processing system illustrating one possible use of memory devices, systems and methods embodying the principles of the present invention.

FIG. 1 is a functional block diagram of a portion of a data processing system 100 embodying the principles of the present invention. System 100 includes a CPU 101, a system memory 102, system address bus 103 and system data bus 104. CPU may directly access system memory 102 through data and address buses 103 and 104 or through core logic 105.

CPU 101 may be for example an Intel 486 or Pentium class microprocessor or the like. System memory 102 is preferably constructed of dynamic random access memory devices (DRAMs) according to the principles of the present invention discussed below. Buses 103 and 104, and core logic 105 are conventional devices known in the art.

Figure 2:
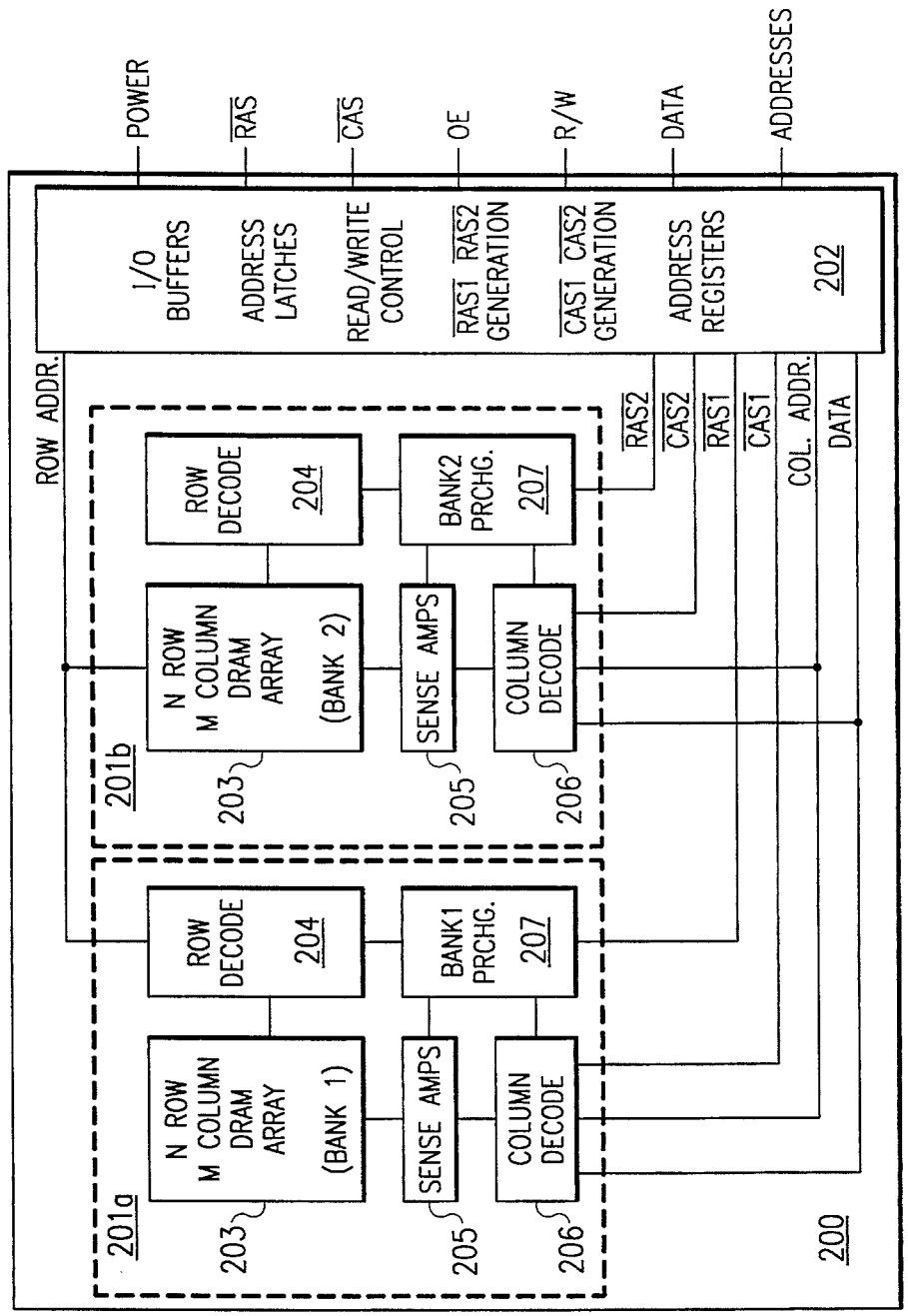
FIG. 2 is a functional block diagram of a memory device embodying some of the principles of the present invention, the memory device of FIG. 2 useful in one application for constructing the system memory shown in FIG. 1.

FIG. 2 is a functional block diagram of a dynamic random access memory device 200 according to one embodiment of the principles of the present invention. Memory 200 includes X number of memory banks or units 201, with two such banks 201a and 201b being provided in the embodiment of FIG. 2. Banks 201 communicate with external circuitry through control circuitry 202, discussed further below. In processing system 100, memory system 200 may be used to construct system memory 102, although many other applications of memory system 200 are possible, such as in a display frame buffer. Preferably, device 200 is a monolithic integrated circuit.

Each bank 201 includes an array 202 of dynamic random access memory (DRAM) cells arranged in two blocks 402a and 402b of N rows and M columns. Each bank 201 further includes a row decoder 204 coupled to the wordlines of the array, sense amplifiers 205 coupled to the bitlines of the array, a column decoder 206 coupled to the sense amplifiers 205, and bank precharge circuitry 207, each of which preferably operates in a conventional fashion. Generally, row decoder selects one of N rows and column decoder selects Y of M number of columns for access during an active cycle. Preferably, each bank 201 is associated with a different row address space (alternatively, each bank 201 may be associated with a different column address space) or even a linear address space.

Control circuitry 202 receives conventional DRAM control signals and clocks from an external source, such as processor 101 or core logic 105 (when used) in system 100. These signals include a row address strobe (RAS), a column address strobe (CAS), read/write select (R/W) and output enable (OE), along with data and addresses. In the preferred embodiment, the address input port is multiplexed in a conventional manner wherein row addresses and column addresses are received sequentially at the same pins and latched in with RAS and CAS respectively.

Figure 3:
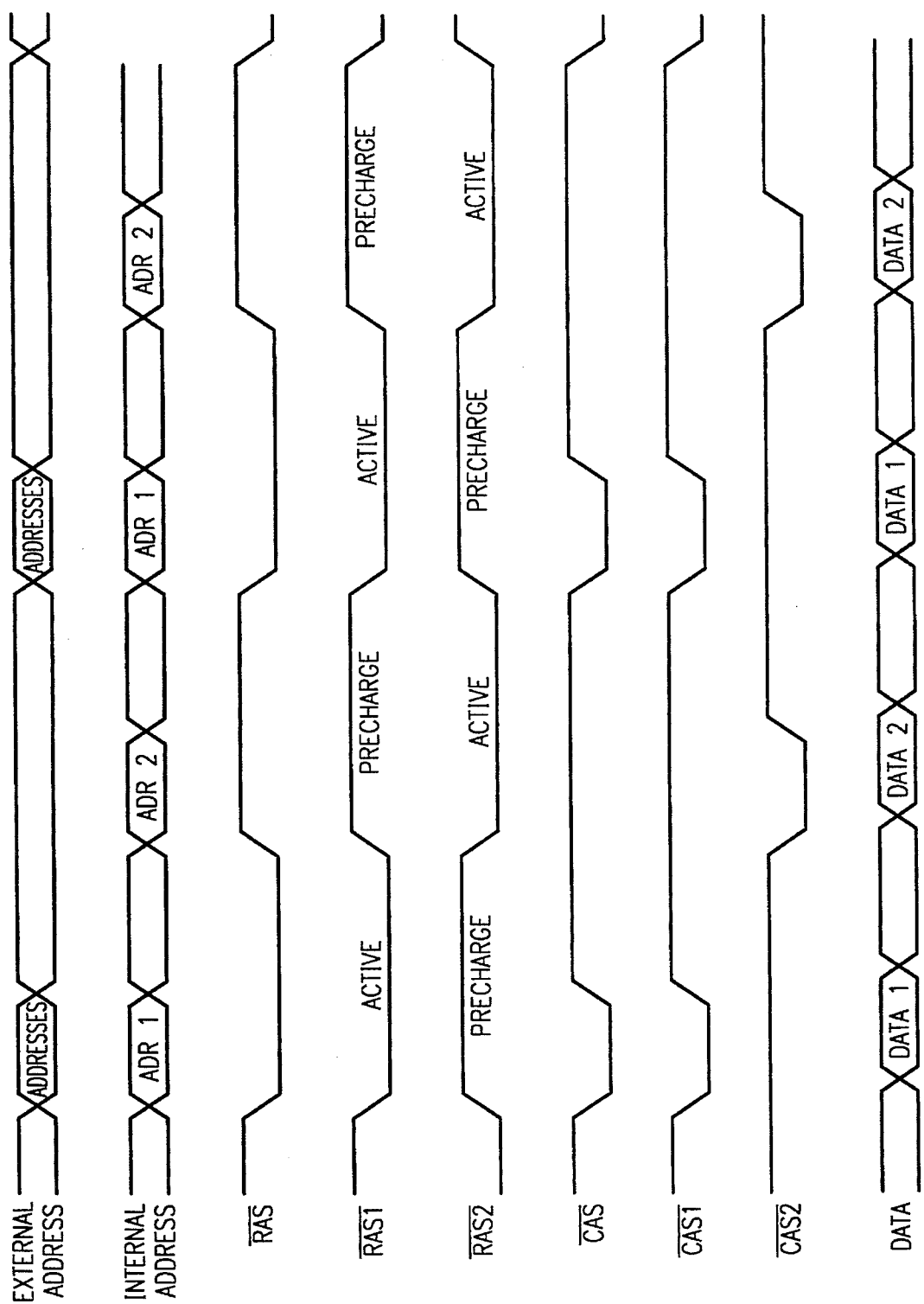
FIG. 3 is a timing diagram illustrating one possible operating mode of the memory device of FIG. 2.

According to the principles of the present invention, control circuitry generates X number of internal RAS signals from the externally received RAS signal. In the two bank embodiment of FIG. 2, two internal complementary clocks RAS1 and RAS2 are generated. The preferred timing relationship between external RAS, RAS1 and RAS2 is illustrated in FIG. 3. Control circuitry 202 also provides internal address strobes CAS1 and CAS2 to each bank 201a and 201b respectively, CAS1 and CAS2 being generated from the externally generated CAS. The preferred timing relationship between CAS, CAS1 and CAS2 is also shown in FIG. 3. The internal clocks RAS1, RAS2, CAS1, and CAS2 may be generated, for example, from phase locked loop signal generators within control circuitry 202. It should be noted than if X number of banks 201 are provided, X number of internal clocks RASX and CASX would be generated.

During each period when RAS1 is low and RAS2 is high, bank 201a (bank 1) is in an active cycle and bank 201b is in precharge, and vice versa. As a result, external addresses can be provided to the input port of memory 200 at a rate approximately twice that of a conventional DRAM. To an external device, memory 200 appears to only be operating in a single active cycle, similar to a SRAM, when the multiple banks are alternately addressed. In addition to timing the precharge and active cycles, the internal RAS and CAS signals time the transfer of address between the address registers of control circuitry 202 and the respective memory banks 201. It should be noted that row and column addresses may be transmitted to a bank X on a single internal address bus, multiplexed using RASX and CASX, respectively.

One scheme of operating memory 200 is shown in FIG. 3. With the externally received RAS and CAS signals, multiple addresses are latched-in and stored in the address registers within control circuitry 202. As is known in the art, the typical RAS and CAS signals have long enough active periods to allow such multiple address input. Assume for discussion purposes that two addresses are stored per each RAS/CAS cycle. When RAS1 goes low, bank 201a (bank 1) goes active, the first row address to bank 201a is presented to and latched into the buffer of the bank 1 row decoder 204.

When CAS1 goes low, the first column address is presented to and latched into the buffer of the bank 1 column decoder 206. After a propagation delay, a data access is made to the addressed cell or cells in array 203 of bank 1. At the same time, RAS2 is high and bank 2 is in precharge. Column decoder 206 and row decoder 204 of bank 2 can be brought to ground to conserve power while the bank 2 sense amplifiers 205 (and corresponding bitlines) are equalized.

When RAS1 goes high and RAS2, bank 1 goes into precharge and bank 2 becomes active. In this case, the second address stored in the address registers of control circuitry 202 is used to access a corresponding cell or cells in bank 2, timed by RAS2 and CAS2. Assuming again that two addresses have been stored in the address registers, the process repeats with the next external RAS and CAS.

Figure 4:
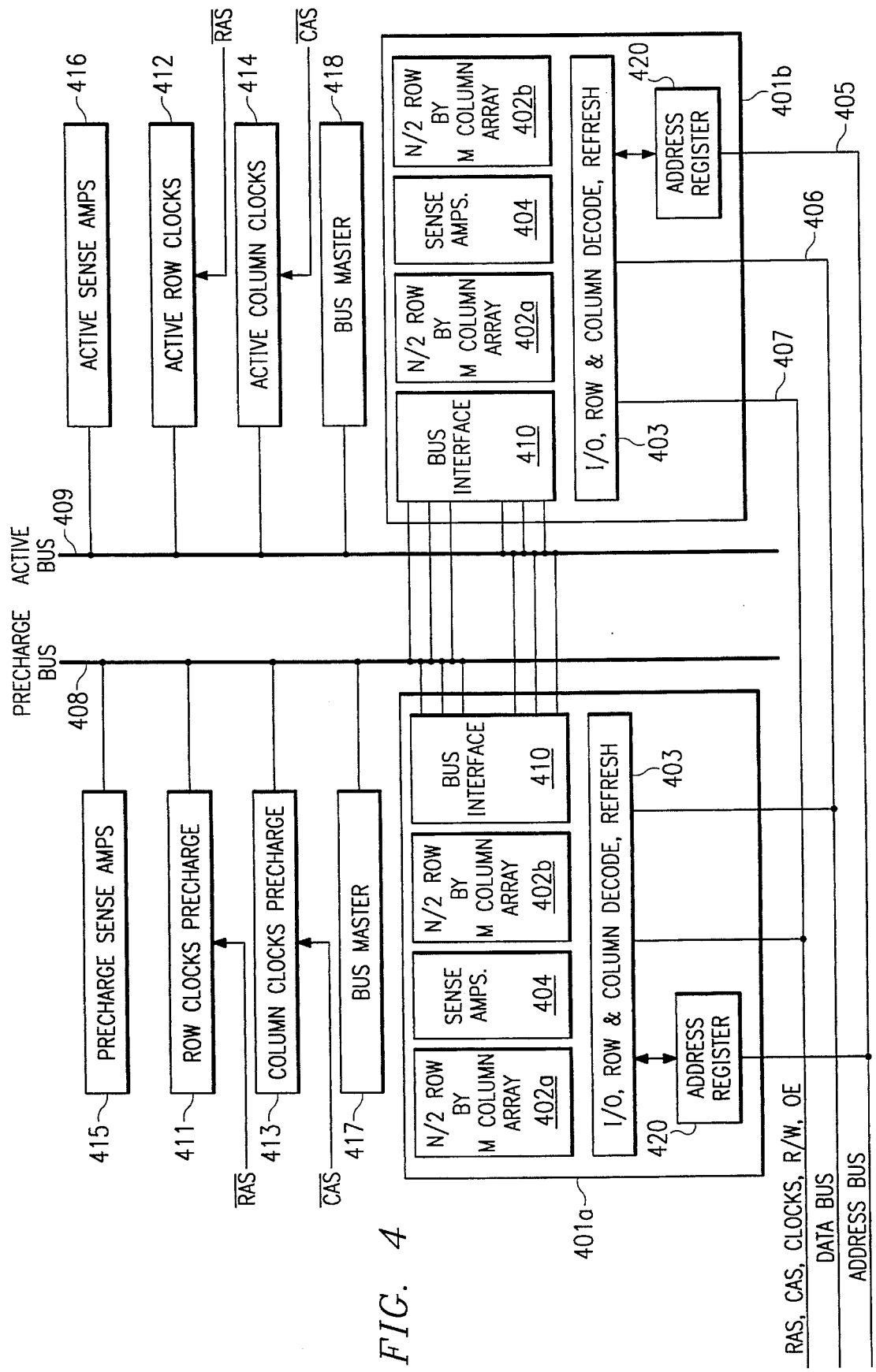
FIG. 4 is a pipelined address memory embodying the principles of the present invention, the memory of FIG. 4 being useful in one application for construction of the system memory of FIG. 1.

FIG. 4 is a functional block of a second dynamic random access memory system 400 according to the principles of the present invention. Memory system 400 may be used in a number of different applications, including system memory 102 of processing system 100, discussed above.

System 400 includes a plurality of X number of memory units 401, where X is greater than or equal to 2. In the illustrated embodiment of FIG. 4, two memory units 401a and 401b are shown for reference. Each memory unit 401 includes an array of memory cells 402, which in the embodiment of FIG. 2 has been partitioned into two blocks 402a and 402b. Each memory unit 401 further includes dedicated input/output, row decoder and column decoder circuitry 403. Data accesses to array 402 are made through sense amplifiers 404. Preferably, each of the X number of memory units 401 is associated with a different address space.

Each of the memory units 401 of system 400 is coupled to an address bus 405, a data bus 406, and a bus 407 carrying RAS and CAS, clocks and control signals, such as read/write (r/w) and output enable (oe). An address register 420 allows for temporary storage (pipelining) of addresses received from address bus 405. Preferably, addresses are input into address registers 420 timed by the externally generated RAS and CAS. Buses 405–407 couple memory units 401 with devices external to system 400 (such as processor 101 or core logic 105) through conventional system input/output circuity (not shown). Each memory unit 401 additionally couples to a precharge bus 408 and an active bus 409 through a bus interface 401.

According to the principles of the present invention, active cycle timing and control is implemented by clocks and control signals carried on active bus 409. Precharge timing and control is implemented by clocks and control signals carried on precharge bus 408. Preferably, precharge bus 408 and active bus 409 operate asynchronously (independently), although common external signals, such as RAS and CAS, may be used to generate the individual clocks and control signals.

Precharge row control clocks are generated by precharge row clock generation circuitry 411, under the timing of the externally generated RAS signal. In particular, the precharge row clocks time the precharge of the row address buffer, the pulling down of the wordlines, and the precharge of related row control circuitry, of each memory unit 401 under precharge. Active row clocks are generated by active row clock circuitry 412. These clocks time the row accesses in the active memory units 401 under the control of active bus 409. In particular, these clocks time the retrieval and decoding of row addresses loaded into the address registers 420 of each active memory unit 401.

Precharge column control clock signals are generated in response to the externally generated column address strobe (CAS) signal by precharge column clock circuitry 413. Generally, these clocks are used to time the precharge the column address buffer and related column control circuitry. Active cycle column clocks are generated from CAS and transmitted on active bus 409 by active column clock circuitry 414. The active column clocks operate in a conventional manner to time either a random access or a page access from the active memory unit 401 through the column decoder of each active memory unit 401. Sense amplifier precharge control circuitry 415 equalizes the sense amplifiers and charges the bitlines of the memory units 401 being controlled by precharge bus 208 at a given time. Conventional sense amplifier control circuitry 416 controls the sense amplifiers of those memory units 201 receiving signals from the active bus 209.

Precharge bus 408 is controlled by bus master/arbiter 417. Among other things, bus master 417, under CPU control, determines which of the X number of memory units 401 are in precharge at a given time and are receiving control signals from precharge bus 408. The determination of which of the X number of memory units 401 are in an active cycle and are under control of the signals on active bus 409 is made by a bus master/arbiter 418, under CPU control. A graphics controller, e.g., Cirrus Logic 75XX series control can also perform this function, freeing up the CPU. Or, one can use the "DRAM controller" typically found in core logic chips to act as the "memory bus arbiter."

The embodiment of FIG. 4 has the advantage of allowing a first number of memory units 401 to be in the active state and accessible (addressable) while a second number of memory units are in the precharge state. By alternating accesses between memory units 401, pipelined addressing is possible and memory system 400 as a whole appears to an external device as operating as a single cycle memory. The 60–70 delays between accesses required in conventional DRAMs for precharge is eliminated.

During each external RAS active cycle one or more row addresses are clocked into the address register 420 of one or more memory units 401. Each memory unit 401 is preferably in a unique address space, and therefore identification of the proper destination unit 401 may be made using the address itself. Most CPUs, such as CPU 101, can track words of data by their address and hence the memory units 401 in which such data are stored. Additionally, through conventional handshaking, CPU 101 and/or core logic 105, can track whether a given memory unit 401 is active or in precharge. If for example, an access is attempted to a memory unit 401 in precharge, that access can be delayed or substituted. Such operations are well known functions of currently available CPU and core logic sets.

During each external CAS active cycle, the associated column addresses are latched into the corresponding address registers. It should be noted addresses can be loaded into address registers 420 independent of whether the corresponding memory units 401 are active or in precharge. Further, while addresses are being decoded and accesses are being performed, additional addresses may simultaneously be input into the address registers.

When a given memory unit 401 is coupled to active bus 409, accesses (reads, writes, or read-modify-writes) are performed under the timing and control of active control circuitry 412, 414 and 416. A memory unit 401 may stay in the active state under the control of address bus 408 until a either a change in row address is required or 10 microseconds (the typical maximum time a wordline can be held high) has expired, at which time a precharge must be performed. For a given row address, a series of column addresses from the address register 420 will allow a stream of random accesses. In the alternative, a single row address and a single column address from a register 420 can initiate a page access from conventional page mode access circuitry associated with the given memory unit 401.

Multiple memory units 401 can be active and under control of active bus 409 at one time. Under one option, multiple memory units 401 may be used to service data bus 406 during accesses. For example, if data bus 406 is 32 bits wide, and each memory unit 401 is a by 16 device, two units 401 are used per access. Alternatively, while an access is being made to one active memory unit 401, one or more other active memory units 401 may be refreshed. Preferably, each memory unit 401 includes its own refresh counter and is controlled by individual read/write (R/W) and output enable (OE) signals. Alternatively, a single refresh controller may be used to control the refresh of all banks in the system.

During precharge, a given memory unit 401 is coupled to precharge bus 408 by bus master 417 and is under control of precharge control circuitry 411, 413 and 415. While precharge row clock circuitry 411 and precharge column clock control circuitry are driven from the external RAS and CAS signals, they operate independently of active row clock circuitry 412 and active column clock circuitry 414. The precharge cycle for a given memory unit 401 is preferably conventional in nature: dynamic circuitry nodes are brought to optimal voltages, sense amplifiers and bitlines are equalized and row and column decoder circuits are shut down.

According to the principles of the present invention, while one or more memory units 401 are active and being accessed under control of active bus 409, at least one other memory unit 401 is in precharge under the control of the signals on precharge bus 408. The memory units 401 then reverse roles when those being currently being accessed require precharge and those currently under precharge are ready for access. As discussed above, this technique at least halves the access time to memory system 400. Access time is further reduced when multiple addresses are loaded into the address registers 420 with each external RAS and CAS and then pipelined to the row and column decoders. In fact, a nearly continuous stream of a data can be read in or read out, in either a page or random fashion. For example, after access to the current row in the active unit 401 is complete (and precharge is required to change rows), the next accesses can be taken from a row in a unit currently under precharge, and so on.

Although the present invention and its advantages have been described in detail, it should be understood that various changes, substitutions and alterations can be made herein without departing from the spirit and scope of the invention as defined by the appended claims.

What is claimed is:

1. A pipelined address memory system comprising:
    a plurality of memory units, each including an array of memory cells and circuitry for accessing selected ones of said cells in said array;
    a precharge bus for carrying precharge control signals;
    an active bus for carrying active cycle control signals;
    circuitry coupled to said precharge bus for generating said precharge control signals;
    circuitry coupled to said active bus for generating said active cycle control signals;
    circuitry for selectively coupling said memory units to said precharge bus for precharge; and
    circuitry for selectively coupling said memory units to said active bus for active operation.

2. The pipelined address memory system of claim 1 wherein said circuitries for coupling couple at least one said memory unit to said precharge bus and simultaneously at least one said memory unit to said active bus.

3. The pipelined address memory system of claim 1 wherein each said memory unit includes an address register for receiving at least one address from an address bus, said address register receiving said at least one address timed by clocks generated by an external source.

4. The pipelined address memory system of claim 1 wherein said circuitry for generating precharge control signals is timed by at least one signal received from an external source.

5. The pipelined address memory system of claim 1 wherein said circuitry for generating active cycle control signals is timed by at least one clock signal received from an external source.

6. A method of operating a pipelined memory system, the pipelined memory system including a plurality of memory units, each memory unit including an array of memory cells and circuitry for accessing locations in the array, a precharge bus for carrying precharge control signals generated by associated precharge control circuitry and an active bus, for carrying active cycle control signals generated by active cycle control circuitry, the method comprising the steps of:

coupling a first selected one of the memory units to the active bus;

performing an access to a selected location in the array of the first memory unit under the control of the active cycle control signals on the active bus;

coupling a second selected one of the memory units to the precharge bus; and substantially simultaneously with said step of performing an access, performing a precharge of the second memory unit under the control of the precharge control signals on the precharge bus.

7. The method of claim 6 and further comprising the steps of:

coupling a third selected one of the memory units to the active bus; and performing a refresh of the array of the third memory unit substantially simultaneously with said step of performing an access.

8. The method of claim 6 and further comprising the steps of:

coupling a third selected one of the memory units to the active bus; and substantially simultaneous with said step of performing an access to the array of the first memory unit, performing an access to the array of the third memory unit.

9. The method of claim 6 wherein said step of performing an access includes the substeps of:

storing at least one address to the array of the first memory unit in an address register in response to at least one signal generated from an external source; and retrieving and decoding said at least one address timed by the active control signals from the active bus.

10. The method of claim 6 wherein said step of performing an access comprises the step of performing a page mode access.

11. A pipelined address memory system comprising:

a plurality of independent memory units each including an array of dynamic random access memory cells, dynamic control circuitry, and an address register;

a precharge bus;

an active cycle bus;

active clock circuitry for generating clocks for memory unit active cycle operations;

precharge clock circuitry for generating clocks for memory unit precharge operations;

bus control circuitry for selectively coupling a first selected one of said memory units with said active clock circuitry via said active bus during active cycle operation of said first memory unit and a second selected one of said memory units to said precharge clock circuitry for simultaneous precharge operation of said second memory unit; and an address bus for providing addresses to said address registers of said memory units for use during subsequent memory accesses during active cycle operation.

12. The memory system of claim 11 and further comprising an external clock bus for providing clocks generated by an external source, an address loaded into a selected said address register in response to at least one of said clocks on said clock bus.

13. The memory of claim 11 wherein said circuitry for selectively coupling includes at least one bus master.

14. The memory system of claim 11 wherein said active clock circuitry comprises:

active row clocks generation circuitry;

active column clocks generation circuitry; and active sense amplifier control circuitry.

15. The memory system of claim 11 wherein said precharge clock circuitry comprises:

precharge row clocks generation circuitry;

precharge column clocks generation circuitry; and precharge sense amplifier control circuitry.

16. The memory system of claim 12 wherein said clocks generated from an external source comprise RAS and CAS signals.

17. The memory system of claim 11 wherein said address bus comprises a multiplexed address bus controlled by RAS and CAS signals received from an external source.

18. The memory system of claim 11 wherein said address bus comprises a non-multiplexed bus.

19. The memory system of claim 18 wherein said non-multiplexed bus is coupled to a selected one of said address registers in response to a single clock provided on an associated clock bus.

20. The memory system of claim 19 wherein said single clock comprises a chip enable signal.

21. The memory system of claim 19 wherein said single clock comprises a synchronous DRAM master clock received from an external source.

* * * * *

UNITED STATES PATENT AND TRADEMARK OFFICE
CERTIFICATE OF CORRECTION

PATENT NO. : 5,598,374  Page 1 of 1
APPLICATION NO. : 08/502479
DATED : January 28, 1997
INVENTOR(S) : G. R. Mohan Rao It is certified that error appears in the above-identified patent and that said Letters Patent is hereby corrected as shown below:

On the Title Pg & Col. 1, lines 1-3

Item [54] should read: PIPELINED ADDRESS MEMORIES, AND SYSTEMS AND METHODS USING THE SAME Signed and Sealed this Seventh Day of September, 2010

David J. Kappos
*Director of the United States Patent and Trademark Office*